United States Patent
Hsu et al.

(10) Patent No.: US 9,653,333 B2
(45) Date of Patent: May 16, 2017

(54) METHOD OF MANUFACTURING LIGHTING EMITTING DEVICE WITH ALIGNED-BONDING

(71) Applicant: EPISTAR CORPORATION, Hsinchu (TW)

(72) Inventors: Chia-Liang Hsu, Hsinchu (TW); Yi-Ming Chen, Hsinchu (TW); Hsin-Chih Chiu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/007,687

(22) Filed: Jan. 27, 2016

(65) Prior Publication Data

US 2016/0197230 A1    Jul. 7, 2016

Related U.S. Application Data

(63) Continuation of application No. 13/784,291, filed on Mar. 4, 2013, now Pat. No. 9,269,859.

(30) Foreign Application Priority Data

Mar. 5, 2012  (TW) .............................. 101107404 A

(51) Int. Cl.
| | |
|---|---|
| H01L 21/68 | (2006.01) |
| H01L 33/00 | (2010.01) |
| H01L 33/02 | (2010.01) |
| B65G 47/24 | (2006.01) |
| H01L 21/67 | (2006.01) |
| H01L 21/66 | (2006.01) |
| H01L 33/64 | (2010.01) |

(52) U.S. Cl.
CPC ............ *H01L 21/681* (2013.01); *B65G 47/24* (2013.01); *H01L 21/67092* (2013.01); *H01L 21/68* (2013.01); *H01L 22/26* (2013.01); *H01L 33/0079* (2013.01); *H01L 33/02* (2013.01); *H01L 33/641* (2013.01)

(58) Field of Classification Search
CPC .... H01L 21/681; H01L 21/68; H01L 33/0079
See application file for complete search history.

(56) References Cited

U.S. PATENT DOCUMENTS

| | | | |
|---|---|---|---|
| 8,377,797 B1 * | 2/2013 | Chin | ...................... H01L 24/29 257/758 |
| 2005/0253161 A1 * | 11/2005 | Horio | ..................... H01L 33/08 257/100 |
| 2007/0012938 A1 | 1/2007 | Yu et al. | |
| 2007/0058904 A1 * | 3/2007 | Ban | ..................... G02B 6/4204 385/52 |
| 2008/0035935 A1 | 2/2008 | Shum | |

(Continued)

*Primary Examiner* — Michael Jung
(74) *Attorney, Agent, or Firm* — Patterson + Sheridan, LLP

(57) ABSTRACT

A method of manufacturing a light-emitting device comprises the steps of: providing a semiconductor light-emitting stack having a first connecting surface and a first alignment pattern; providing a substrate having a second connecting surface and a second alignment pattern; detecting the position of the first alignment pattern and the position of the second alignment pattern; and moving at least one of the substrate and the semiconductor light-emitting stack to make the first alignment pattern be aligned with the second alignment pattern.

14 Claims, 10 Drawing Sheets

(56) References Cited

U.S. PATENT DOCUMENTS

| | | | |
|---|---|---|---|
| 2008/0124845 A1* | 5/2008 | Yu | H01L 21/76898 438/143 |
| 2011/0204399 A1 | 8/2011 | Lim et al. | |
| 2013/0095581 A1* | 4/2013 | Lee | H01L 33/0095 438/26 |
| 2013/0201639 A1* | 8/2013 | Ryu | H05K 1/0269 361/749 |

\* cited by examiner

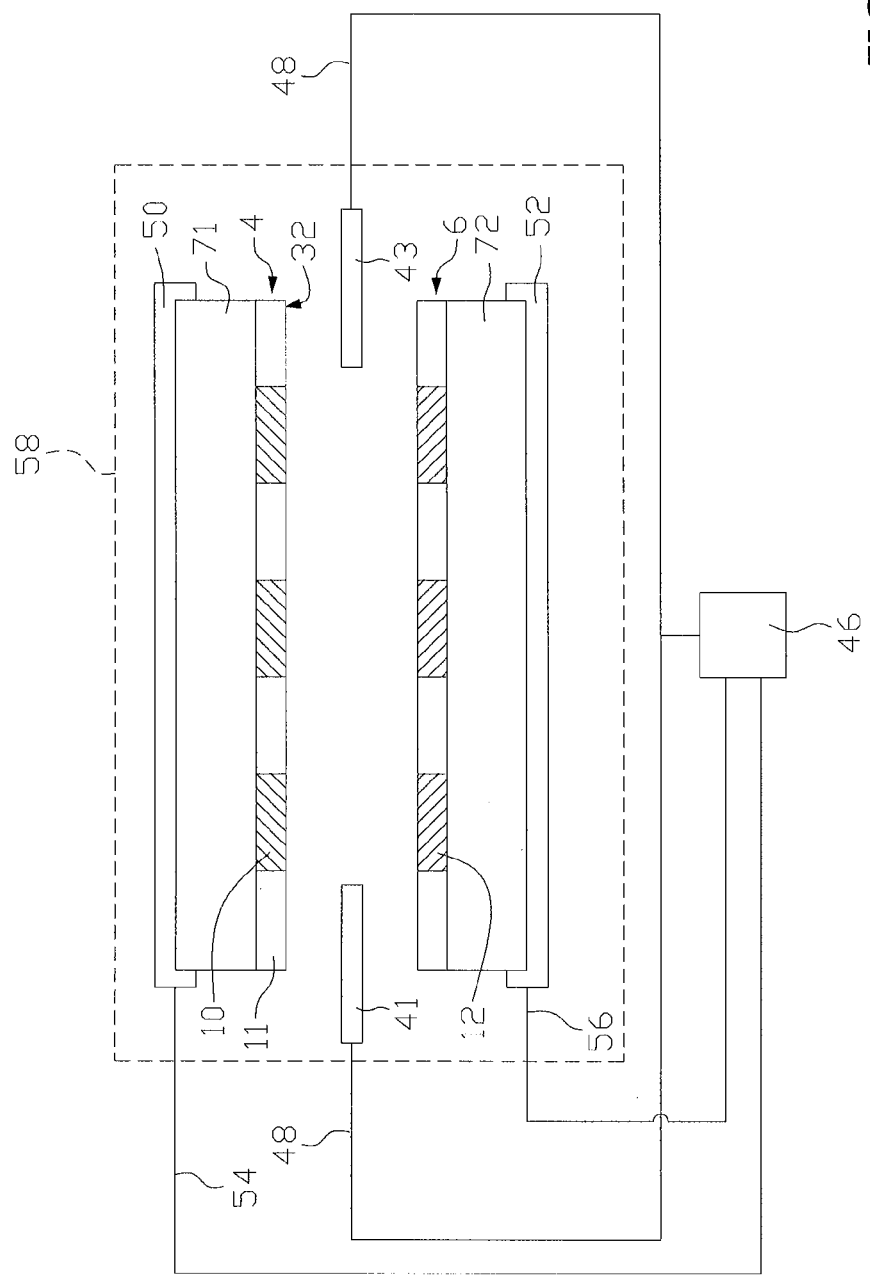

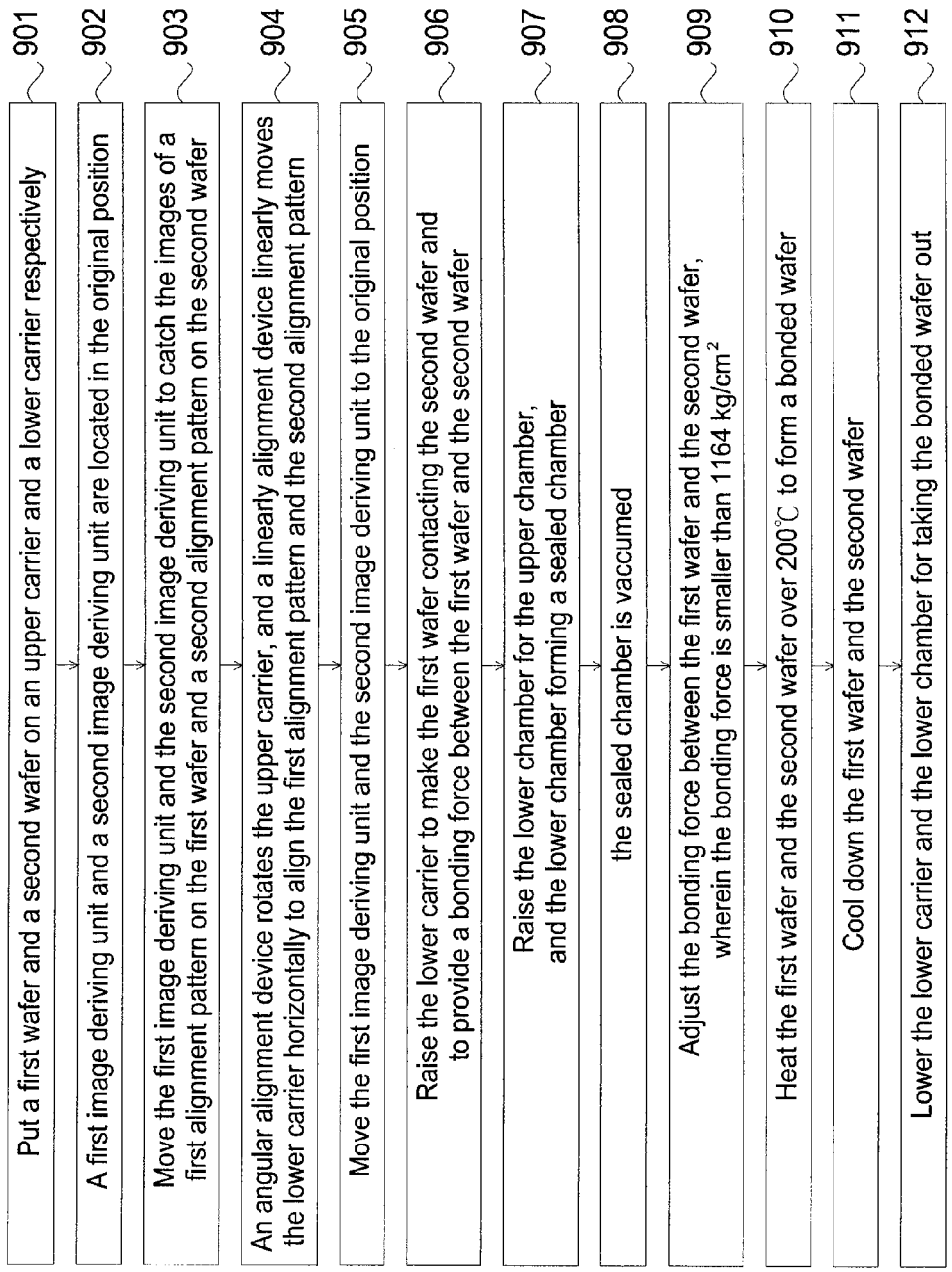

METHOD OF MANUFACTURING LIGHTING EMITTING DEVICE WITH ALIGNED-BONDING

REFERENCE TO RELATED APPLICATION

This application is a continuation application of U.S. patent application Ser. No. 13/784,291, now issued as U.S. Pat. No. 9,269,859, which claims the right of priority based on TW application Serial No. 101107404, filed on Mar. 5, 2012, and the content of which is hereby incorporated by reference in its entirety.

TECHNICAL FIELD

The present application relates to a light-emitting device and the manufacturing method thereof.

DESCRIPTION OF BACKGROUND ART

As the technology develops, the semiconductor optoelectrical device has a great contribution in information transmission and energy conversion. For example, the semiconductor optoelectrical device can be applied to fiber-optic communication, optical storage and military system. Generally, the semiconductor optoelectrical device can be classified as three categories according to energy conversion type: converting electrical energy to light, such as light-emitting diode and laser diode; converting light to electrical energy, such as optical detector; converting the radiation energy of light to electrical energy, such as solar cell.

The growth substrate is very important to semiconductor optoelectrical devices. The semiconductor epitaxial layers of a semiconductor optoelectrical device are grown on the growth substrate, and the growth substrate also provides the supporting function to carry the semiconductor epitaxial layer. But, different semiconductor epitaxial layers need different growth substrates. In order to form the semiconductor epitaxial layer with high quality, it is important to choose a suitable growth substrate.

However, sometimes a good growth substrate is not a suitable carrier substrate for carrying the semiconductor epitaxial layer. Taking the light-emitting diode as an example, in the manufacturing processes of the red light diode, in order to form a better semiconductor epitaxial layer, GaAs substrate is generally selected as the growth substrate because the lattice constant of GaAs substrate is close to that of the semiconductor epitaxial layer though GaAs is opaque and has low heat dissipation, which is adverse to the ultra-bright light-emitting diode which requires good heat dissipation. Such kind of growth substrate with low heat dissipation ability would cause the light-emitting efficiency to decline dramatically.

In order to satisfy the different requirement of the growth substrate and the carrier substrate of semiconductor optoelectrical devices, the substrate transfer technology is developed. Namely, the semiconductor epitaxial layer is firstly formed on the growth substrate, and then the semiconductor epitaxial layer is bonded to the carrier substrate for further processing.

The known ultra-bright light-emitting diode is produced by wafer to wafer bonding. The bonding layer, which is composed of metal or non-metal material, is used to bond the semiconductor epitaxial layer and the heat-dissipation substrate together. However, the bonding layer of a single material would limit the flexibility of light-emitting diode design and the following wafer level package.

SUMMARY OF THE DISCLOSURE

A method of manufacturing a light-emitting device comprises the steps of: providing a semiconductor light-emitting stack having a first connecting surface and a first alignment pattern; providing a substrate having a second connecting surface and a second alignment pattern; detecting the position of the first alignment pattern and the position of the second alignment pattern; and moving at least one of the substrate and the semiconductor light-emitting stack to make the first alignment pattern be aligned with the second alignment pattern.

BRIEF DESCRIPTION OF THE DRAWINGS

FIGS. 7A to 7B show the method of manufacturing an aligned-bonding light-emitting device in according with the seventh embodiment of the present application;

FIG. 9 shows a method of manufacturing an aligned-bonding light-emitting device by use of the alignment bonding equipment shown in FIG. 8 in according with the ninth embodiment of the present application.

DETAILED DESCRIPTION OF PREFERRED EMBODIMENTS

Figure 1:
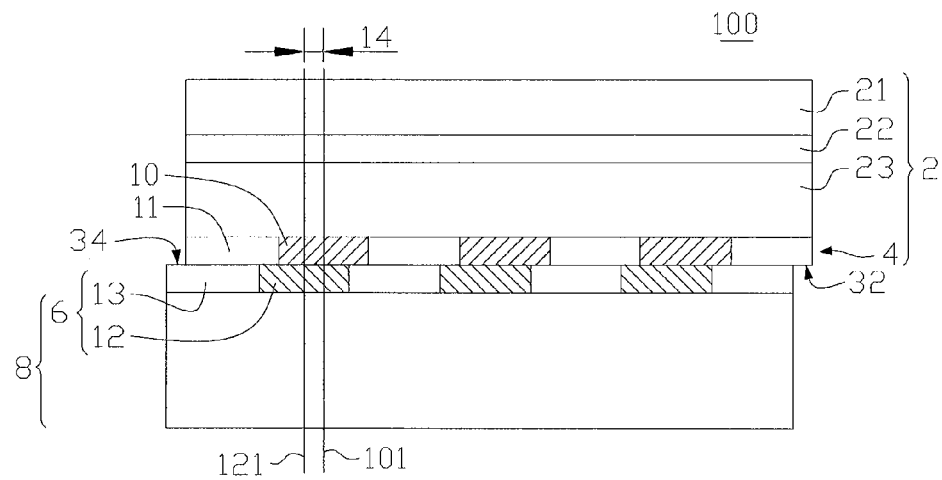
FIG. 1 schematically shows an aligned-bonding light-emitting device in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not in precise scale and components may be exaggerated in view of width, height, length, etc. Herein, the similar or identical reference numerals will denote the similar or identical components throughout the drawings.

First Embodiment

FIG. 1 schematically shows an aligned-bonding light-emitting device 100 in accordance with the first embodiment of the present application. In the first embodiment, a semiconductor light-emitting stacked layer 2 comprises a first semiconductor layer 21, an active layer 22, and a second semiconductor layer 23. When the first semiconductor layer 21 is composed of p-type semiconductor material, the second semiconductor layer 23 is composed of n-type semiconductor material. Conversely, when the first semiconductor layer 21 is composed of n-type semiconductor material, the second semiconductor layer 23 is composed of p-type semiconductor material. The active layer 22, which is between the first semiconductor layer 21 and the second semiconductor layer 23, can be composed of intrinsic semiconductor material. When an electrical current flows through semiconductor light-emitting stacked layer 2, the active layer 22 can emit a light. When the active layer 22 is composed of $Al_aGa_bIn_{1-a-b}P$, the active layer 22 can emit a red, orange, or yellow light. When the active layer 22 is composed of $Al_cGa_dIn_{1-c-d}N$, the active layer 22 can emit a blue or green light.

The semiconductor light-emitting stacked layer 2 further comprises a first connecting layer 4. The first connecting layer 4 comprises a first alignment pattern 10, a first non-alignment region 11 and a first connecting surface 32 for aligned-bonding with a substrate 8, wherein the difference of the reflectivities between the first alignment pattern 10 and the first non-alignment region 11 is at least larger than 20%. When the first alignment pattern 10 is composed of the material with the reflectivity larger than 50%, the first non-alignment region 11 is composed of the material with the reflectivity smaller than 30%. The material with the reflectivity larger than 50% comprises metal, such as Ag, Au, Al, In, Sn, Cr, Ni, Pt or the combination thereof. The material with the reflectivity smaller than 30% comprises organic adhesive material, such as polyimide, BCB, PFCB, epoxy, acrylic resin, COC, PMMA, PET, PC, polyetherimide, fluorocarbon polymer and silicone; oxide material, such as glass, $Al_2O_3$, $SiO_2$, $TiO_2$, SOG, ITO, MgO, InO, SnO, CTO, ATO, AZO, ZTO and ZnO, or other dielectric material, such as $SiN_x$.

The substrate 8 is excellent in heat dissipation. The material of the substrate 8 comprises ceramic substrate, silicon substrate, silicon carbide substrate, anodic aluminum substrate, aluminum nitride substrate or composite material substrate. The substrate 8 comprises a second connecting layer 6 thereon. The second connecting layer 6 comprises a second alignment pattern 12, a second non-alignment region 13, and a second connecting surface 34 for aligned-bonding with the semiconductor light-emitting stacked layer 2, wherein the difference of the reflectivities between the second alignment pattern 8 and the second non-alignment region 13 is at least larger than 20%. When the second alignment pattern 12 is composed of the material with the reflectivity larger than 50%, the second non-alignment region 13 is composed of the material with the reflectivity smaller than 30%. The material with the reflectivity larger than 50% comprises metal such as Ag, Au, Al, In, Sn, Cr, Ni, Pt or the combination thereof. The material with the reflectivity smaller than 30% comprises organic adhesive material, such as polyimide, BCB, PFCB, epoxy, acrylic resin, COC, PMMA, PET, PC, polyetherimide, fluorocarbon polymer and silicone; oxide material, such as glass, $Al_2O_3$, $SiO_2$, $TiO_2$, SOG, ITO, InO, MgO, SnO, CTO, ATO, AZO, ZTO and ZnO, or other dielectric material, such as $SiN_x$. By aligning and bonding the second connecting layer 6 and the first connecting layer 4, the substrate 8 and the semiconductor light-emitting stacked layer 2 form an aligned-bonding light-emitting device 100.

In the aligned-bonding light-emitting device 100, the first alignment pattern 10 is corresponding to the second alignment pattern 12. In the first embodiment, the first alignment pattern 10 and the second alignment pattern 12 are overlapped. Specifically, if a first virtual vertical axis 101 passing through the center of the first alignment pattern 10 and a second virtual vertical axis 121 passing through the center of the second alignment pattern 12 have an offset distance 14 between thereof, the offset distance 14 is smaller than 20 μm.

Second Embodiment

Figure 2A:
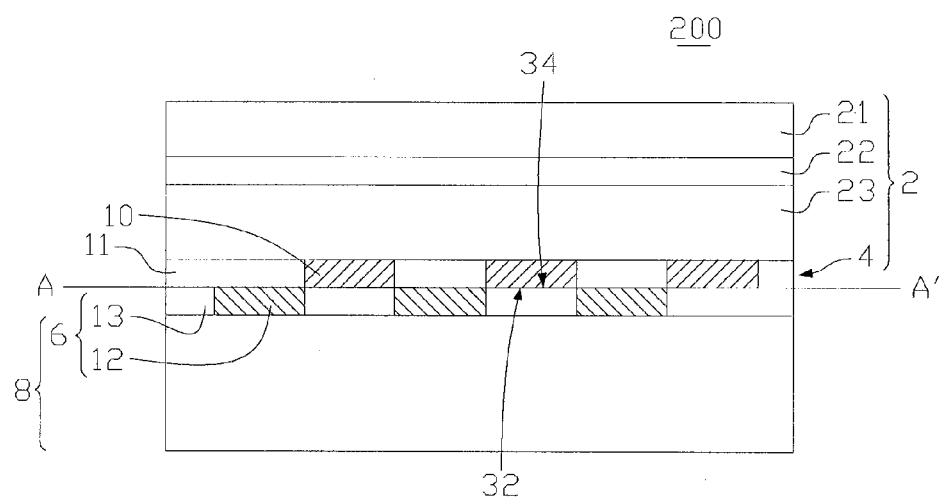
FIGS. 2A and 2B show an aligned-bonding light-emitting device 200 in accordance with the second embodiment of the present application.
Figure 2B:
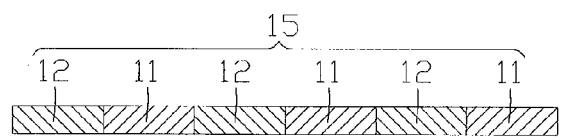

FIGS. 2A and 2B show an aligned-bonding light-emitting device 200 in accordance with the second embodiment of the present application. As FIG. 2A shows, the difference between the aligned-bonding light-emitting device 200 and the aligned-bonding light-emitting device 100 disclosed in the first embodiment is the way the first alignment pattern 10 corresponds to the second alignment pattern 12. In the second embodiment, the first alignment pattern 10 and the second alignment pattern 12 form a third pattern 15, which can be seen as the top view of AA' in FIG. 2B.

Third Embodiment

Figure 3:
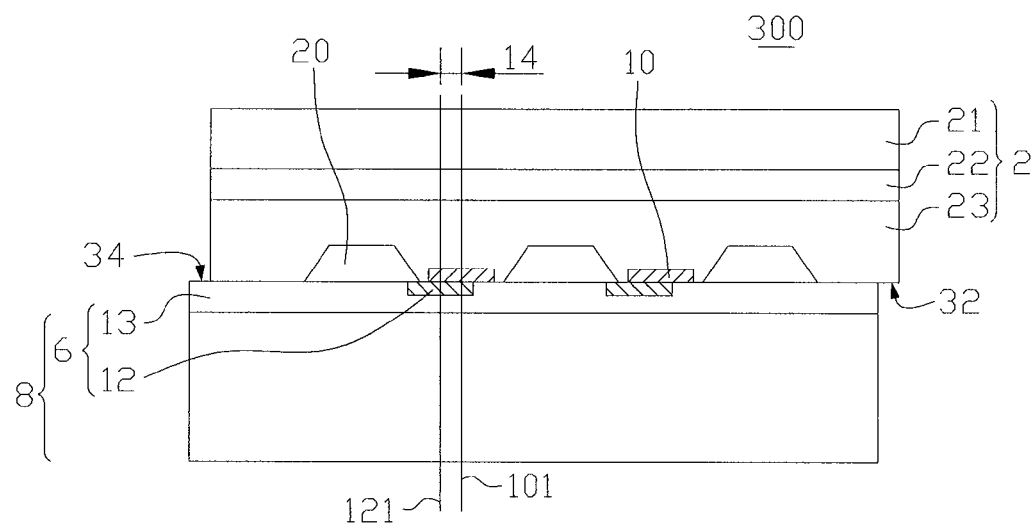
FIG. 3 shows an aligned-bonding light-emitting device in accordance with the third embodiment of the present application.

FIG. 3 shows an aligned-bonding light-emitting device 300 in accordance with the third embodiment of the present application. In the third embodiment, a semiconductor light-emitting stacked layer 2 comprises a first semiconductor layer 21, an active layer 22, and a second semiconductor layer 23. When the first semiconductor layer 21 is composed of p-type semiconductor material, the second semiconductor layer 23 is composed of n-type semiconductor material. Conversely, when the first semiconductor layer 21 is composed of n-type semiconductor material, the second semiconductor layer 23 is composed of p-type semiconductor material. The active layer 22, which is between the first semiconductor layer 21 and the second semiconductor layer 23, can be composed of intrinsic semiconductor material. When an electrical current flows through semiconductor light-emitting stacked layer 2, the active layer 22 can emit a light. When the active layer 22 is composed of $Al_aGa_bIn_{1-a-b}P$, the active layer 22 is able to emit a red, orange, or yellow light. When the active layer 22 is composed of $Al_cGa_dIn_{1-c-d}N$, the active layer 22 can emit a blue or green light.

The semiconductor light-emitting stacked layer 2 further comprises a first connecting surface 32. The first connecting surface 32 comprises a plurality of first cavities 20 and a plurality of first alignment patterns 10. The plurality of first cavities 20 can avoid directly contacting a substrate 8 thereunder so the metallic units do not electrically contact the substrate 8 and/or is for design consideration of the electrical current spreading routes, while the opening of the plurality of first cavities 20 faces the substrate 8 thereunder. The plurality of first alignment patterns 10 is on a region of the first connection surface 32 where no first cavity 20 is disposed on. The plurality of first alignment patterns 10 is composed of the material with the reflectivity 20% larger than that of the second semiconductor layer 23 and comprises metal, such as Ag, Au, Al, In, Sn, Cr, Ni, Pt, or the combination thereof.

The substrate 8 is excellent for heat dissipation. The material of the substrate 8 comprises ceramic substrate, silicon substrate, silicon carbide substrate, anodic aluminum substrate, aluminum nitride substrate, or composite material substrate. The substrate 8 comprises a second connecting layer 6 thereon. The second connecting layer 6 comprises a second alignment pattern 12, a second non-alignment region 13, and a second connecting surface 34 for aligned-bonding with the semiconductor light-emitting stacked layer 2, wherein the difference of the reflectivities between the second alignment pattern 8 and the second non-alignment region 13 is at least larger than 20%. When the second alignment pattern 12 is composed of the material with the reflectivity larger than 50%, the second non-alignment region 13 is composed of the material with the reflectivity smaller than 30%. The material with the reflectivity larger than 50% comprises metal, such as Ag, Au, Al, In, Sn, Cr, Ni, Pt or the combination thereof. The material with the reflectivity smaller than 30% comprises organic adhesive material, such as polyimide, BCB, PFCB, epoxy, acrylic resin, COC, PMMA, PET, PC, polyetherimide, fluorocarbon polymer and silicone; oxide material, such as glass, $Al_2O_3$, $SiO_2$, $TiO_2$, SOG, ITO, InO, MgO, SnO, CTO, ATO, AZO, ZTO and ZnO, or other dielectric material, such as $SiN_x$. By aligning and bonding the first connecting surface 32 and the second connecting surface 34, the substrate 8 and the semiconductor light-emitting stacked layer 2 are formed to be an aligned-bonding light-emitting device 300.

In the aligned-bonding light-emitting device 300, the first alignment pattern 10 is corresponding to the second alignment pattern 12. In the third embodiment, the first alignment pattern 10 and the second alignment pattern 12 are overlapped. Specifically, if a first virtual vertical axis 101 passing through the center of the first alignment pattern 10 and a second virtual vertical axis 121 passing through the center of the second alignment pattern 12 have an offset distance 14 between thereof, the offset distance 14 is smaller than 20 μm.

Fourth Embodiment

Figure 4:
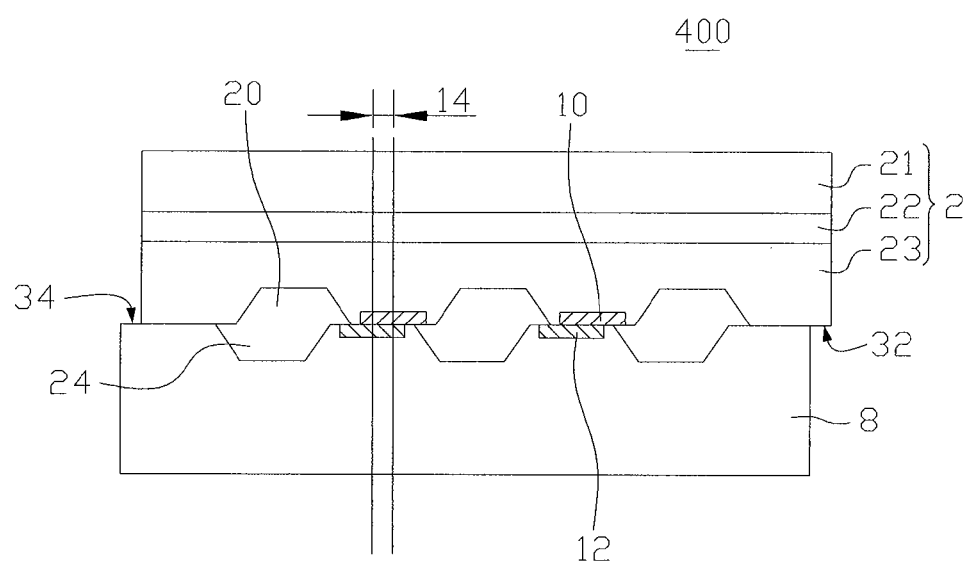
FIG. 4 shows an aligned-bonding light-emitting device in according with the fourth embodiment of the present application.

FIG. 4 shows an aligned-bonding light-emitting device 400 in accordance with the fourth embodiment of the present application. In the fourth embodiment, a semiconductor light-emitting stacked layer 2 comprises a first semiconductor layer 21, an active layer 22, and a second semiconductor layer 23. When the first semiconductor layer 21 is composed of p-type semiconductor material, the second semiconductor layer 23 is composed of n-type semiconductor material. Conversely, when the first semiconductor layer 21 is composed of n-type semiconductor material, the second semiconductor layer 23 is composed of p-type semiconductor material. The active layer 22, which is between the first semiconductor layer 21 and the second semiconductor layer 23, can be composed of intrinsic semiconductor material. When an electrical current flows through semiconductor light-emitting stacked layer 2, the active layer 22 can emit a light. When the active layer 22 is composed of $Al_aGa_bIn_{1-a-b}P$, the active layer 22 can emit a red, orange, or yellow light. When the active layer 22 is composed of $Al_cGa_dIn_{1-c-d}N$, the active layer 22 can emit a blue or green light.

The semiconductor light-emitting stacked layer 2 further comprises a first connecting surface 32. The first connecting surface 32 comprises a plurality of first cavities 20 and a plurality of first alignment patterns 10. The plurality of first cavities 20 can avoid directly contacting a substrate 8 thereunder so the metallic units do not electrically contact the substrate 8 and/or is for design consideration of the electrical current spreading routes, while the opening of the plurality of first cavities 20 faces the substrate 8 thereunder. The plurality of first alignment patterns 10 is on a region of the first connecting surface 32 where no first cavity 20 is disposed on. The plurality of first alignment patterns 10 is composed of the material with the reflectivity 20% larger than that of the second semiconductor layer 23 and comprises metal, such as Ag, Au, Al, In, Sn, Cr, Ni, Pt or the combination thereof.

The substrate 8 is excellent for heat dissipation. The material of the substrate 8 comprises ceramic substrate, silicon substrate, silicon carbide substrate, anodic aluminum substrate, aluminum nitride substrate or composite material substrate. The substrate 8 comprises a second connecting surface 34. The second connecting surface 34 comprises a plurality of second cavities 24 and a plurality of second alignment patterns 12. The plurality of second cavities 24 can avoid directly contacting the semiconductor light-emitting stacked layer 2 thereon so the metallic units do not electrically contact the semiconductor light-emitting stacked layer 2 and/or is for design consideration of the electrical current spreading routes, while the opening of the plurality of second cavities 24 faces the semiconductor light-emitting stacked layer thereon. The plurality of second alignment patterns 12 is on a region of the second connecting surface 34 where no second cavity 24 is disposed on. The plurality of second alignment patterns 12 is composed of the material with the reflectivity 20% larger than that of the substrate 8, comprising metal, such as Ag, Au, Al, In, Sn, Cr, Ni, Pt or the combination thereof. By aligning and bonding the first connecting surface 32 and the second connecting surface 34, the substrate 8 and the semiconductor light-emitting stacked layer 2 are formed to be an aligned-bonding light-emitting device 400.

In the aligned-bonding light-emitting device 400, the first alignment pattern 10 is corresponding to the second alignment pattern 12. In the fourth embodiment, the first alignment pattern 10 and the second alignment pattern 12 are overlapped. Specifically, if a first virtual vertical axis 101 passing through the center of the first alignment pattern 10 and a second virtual vertical axis 121 passing through the center of the second alignment pattern 12 have an offset distance 14 between thereof, the offset distance 14 is smaller than 20 μm.

Fifth Embodiment

Figure 5:
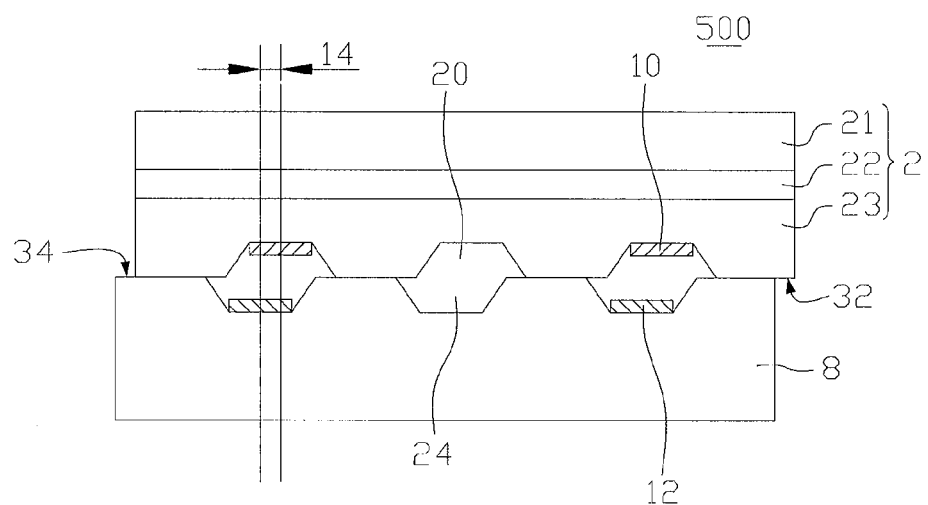
FIG. 5 shows an aligned-bonding light-emitting device in accordance with the fifth embodiment of the present application.

FIG. 5 shows an aligned-bonding light-emitting device 500 in accordance with the fifth embodiment of the present application. As FIG. 5 shows, the difference between the fifth embodiment and the fourth embodiment is that the plurality of first alignment patterns 10 is in a part of the plurality of first cavities 20 to avoid contacting the substrate 8 thereunder, and the plurality of second alignment patterns 12 is in a part of the plurality of second cavities 24 to avoid contacting the semiconductor light-emitting stacked layer 2 thereon.

Sixth Embodiment

Figure 6A:
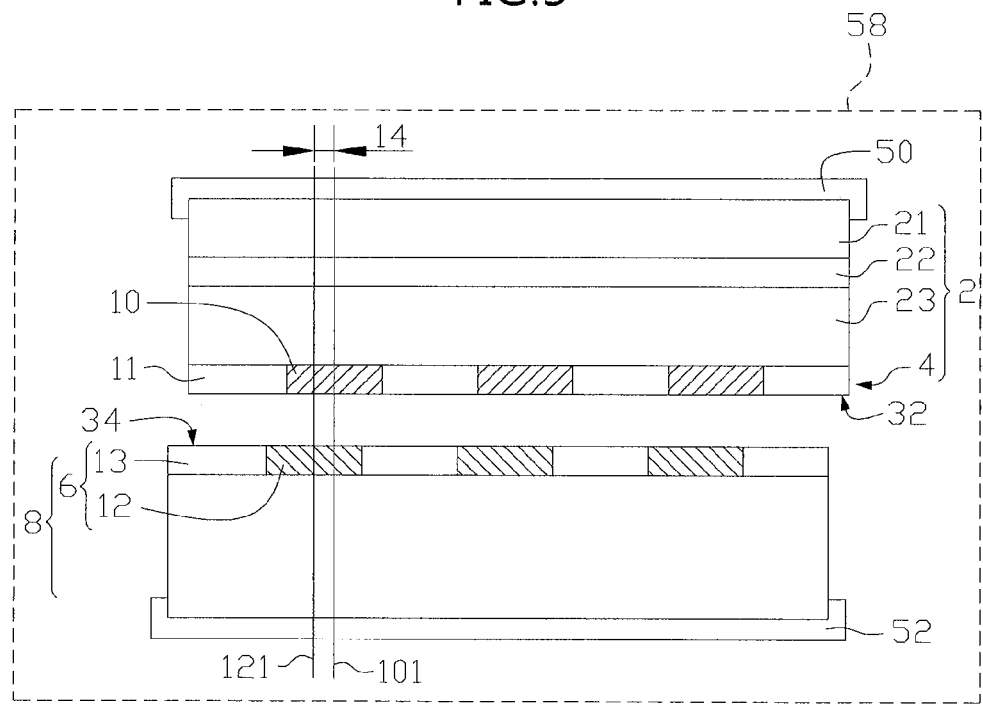
FIGS. 6A to 6D show the method of manufacturing an aligned-bonding light-emitting device in according with the sixth embodiment of the present application.
Figure 6B:
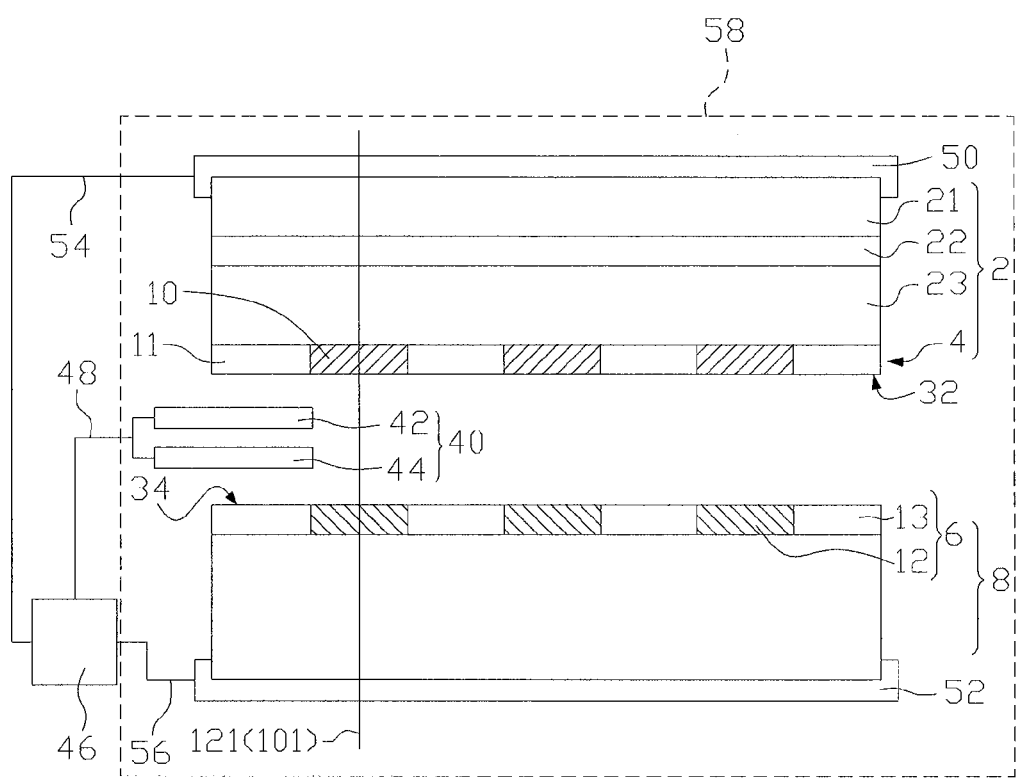
Figure 6C:
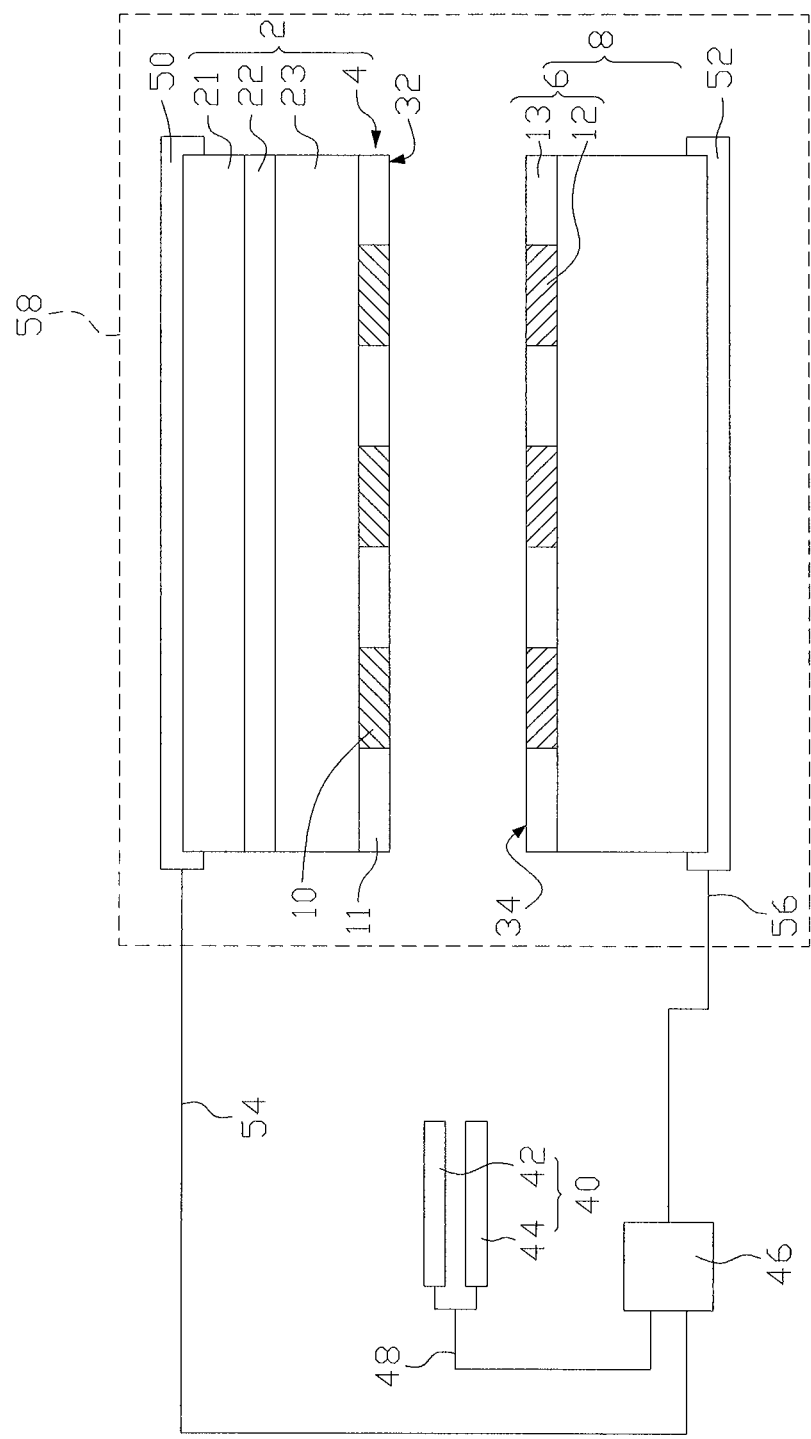

FIGS. 6A to 6C show the method of manufacturing an aligned-bonding light-emitting device in accordance with the sixth embodiment of the present application. FIG. 6A schematically shows that a chamber 58 and a semiconductor light-emitting stacked layer 2 is located and fixed on an upper carrier 50 in the chamber 58. The semiconductor light-emitting stacked layer 2 is fixed on the upper carrier 50 so the position of the semiconductor light-emitting stacked layer 2 can be controlled. The semiconductor light-emitting stacked layer 2 comprises a first semiconductor layer 21, an active layer 22, and a second semiconductor layer 23. When the first semiconductor layer 21 is composed of p-type semiconductor material, the second semiconductor layer 23 is composed of n-type semiconductor material. Conversely, when the first semiconductor layer 21 is composed of n-type semiconductor material, the second semiconductor layer 23 is composed of p-type semiconductor material. The active layer 22, which is between the first semiconductor layer 21 and the second semiconductor layer 23, can be composed of intrinsic semiconductor material. When an electrical current flows through semiconductor light-emitting stacked layer 2, the active layer 22 can emit a light. When the active layer 22 is composed of $Al_aGa_bIn_{i-a-b}P$, the active layer 22 can emit a red, orange or yellow light. When the active layer 22 is composed of $Al_cGa_dIn_{1-c-d}N$, the active layer 22 can emit a blue or green light. The semiconductor light-emitting stacked layer 2 further comprises a first connecting layer 4. The first connecting layer 4 comprises a first alignment pattern 10, a first non-alignment region 11, and a first connecting surface 32 for aligned-bonding with a substrate 8, wherein the difference of the reflectivities between the first alignment pattern 10 and the first non-alignment region 11 is at least larger than 20%. The substrate 8 has excellent heat dissipation ability and is located and fixed on a lower carrier 52 so the position of the substrate 8 is able to be controlled. The material of the substrate 8 comprises ceramic substrate, silicon substrate, silicon carbide substrate, anodic aluminum substrate, aluminum nitride substrate or composite material substrate. The substrate 8 comprises a second connecting layer 6 thereon. The second connecting layer 6 comprises a second alignment pattern 12, a second non-alignment region 13 and a second connecting surface 34 for aligned-bonding with the semiconductor light-emitting stacked layer 2, wherein the difference of the reflectivities between the second alignment pattern 12 and the second non-alignment region 13 is at least larger than 20%. A first virtual vertical axis 101 passing through the center of the first alignment pattern 10 and a second virtual vertical axis 121 passing through the center of the second alignment pattern 12 comprise an offset distance 14 between thereof.

FIG. 6B schematically shows that an image deriving unit 40 is provided between the semiconductor light-emitting stacked layer 2 and the substrate 8. The image deriving unit 40 comprises an upper image deriving unit 42 and a lower image deriving unit 44. The upper image deriving unit 42 is operable for deriving the image of the first alignment pattern 10, and the lower image deriving unit 44 is operable for deriving the image of the second alignment pattern 12, wherein the upper image deriving unit 42 and the lower image deriving unit 44 use CCD or COMS to derive image. Then, the image of the first alignment pattern 10 and the image of the second alignment pattern 12 are transferred to a controller 46 by an image transferring device 48. Then, the controller 46 compares the image of the first alignment pattern 10 and the image of the second alignment pattern 12. And, at the same time, the controller 46 drives the upper carrier 50 and the lower carrier 52 by a control signal transferring device 54 and a control signal transferring device 56 respectively to linearly move or rotate the semiconductor light-emitting stacked layer 2 and the substrate 8 respectively. When the controller 46 detects that the first alignment pattern 10 and the second alignment pattern 12 are aligned to each other, the controller 46 is going to stop driving the upper carrier 50 and the lower carrier 52, and move the image deriving unit 40 out of the chamber 58, as FIG. 6C shows. In above embodiments, the offset distance 14 between the first virtual vertical axis 101 and the second virtual vertical axis 121 is smaller than 20 μm.

Figure 6D:
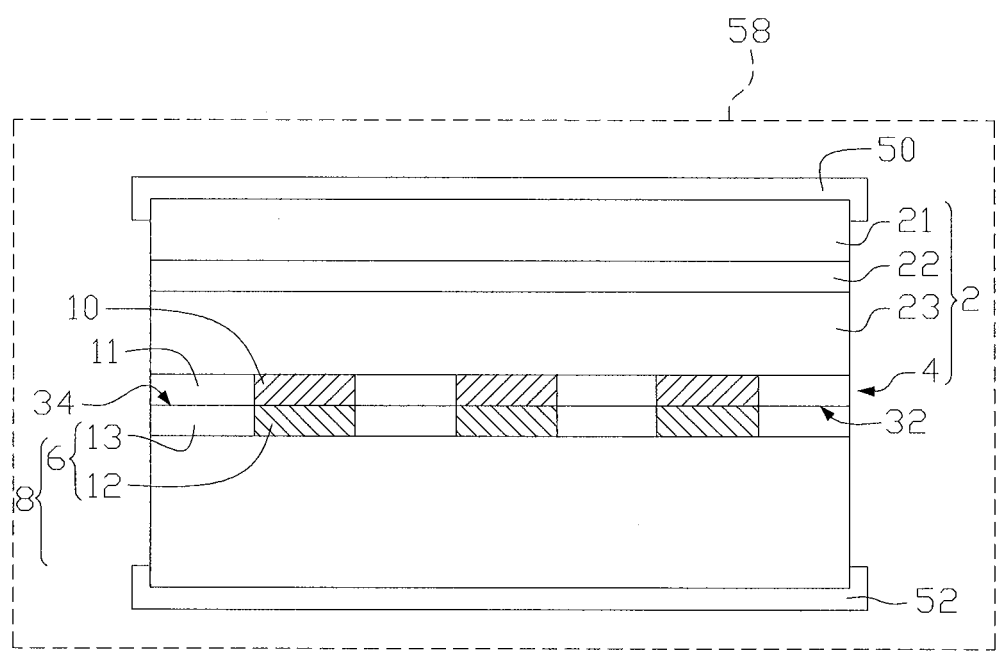

FIG. 6D schematically shows that the image deriving unit 40 is moved away from the chamber 58 and the chamber 58 is vacuumed, wherein the air pressure of the chamber 58 is near 0 kgf/cm². Then, the chamber 58 is heated to at least over 200° C. A bonding force is provided to the semiconductor light-emitting stacked layer 2 and the substrate 8, wherein the bonding force is not over 1164 Kg/cm², to make the first connecting layer 4 be adhered with the second connecting layer 6.

Seventh Embodiment

Figure 7B:
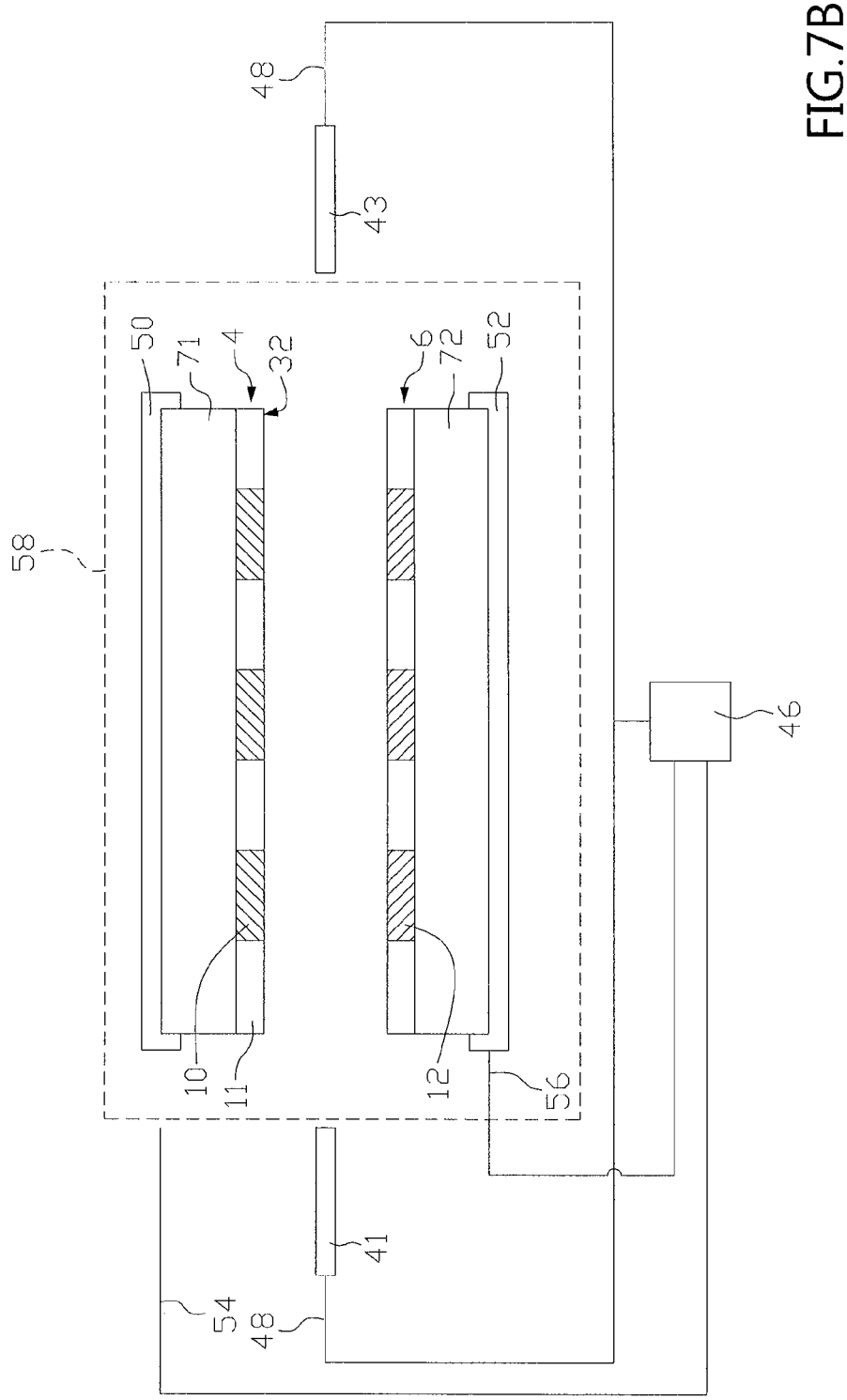

FIGS. 7A to 7B show the method of manufacturing an aligned-bonding light-emitting device in accordance with the seventh embodiment of the present application. As FIG. 7A schematically shows, the difference between the seventh embodiment and the sixth embodiment is that the image deriving unit 40 comprises a first image deriving unit 41 and a second image deriving unit 43, wherein the first image deriving unit 41 and the second image deriving unit 43 are capable of catching the images of different regions of the first alignment pattern 10 of a first wafer 71 and the second alignment pattern 12 of a second wafer 72 at the same time so the time needed for aligning the first alignment pattern 10 and the second alignment pattern 12 can be shortened. Each of the first wafer 71 and the second wafer 72 can be a substrate or a semiconductor light-emitting stacked layer.

As FIG. 7B shows, after the first alignment pattern 10 and the second alignment pattern 12 being aligned to each other, the first image deriving unit 41 and the second image deriving unit 43 are moved out of the chamber 58 and disposed on the different places.

Eighth Embodiment

Figure 8:
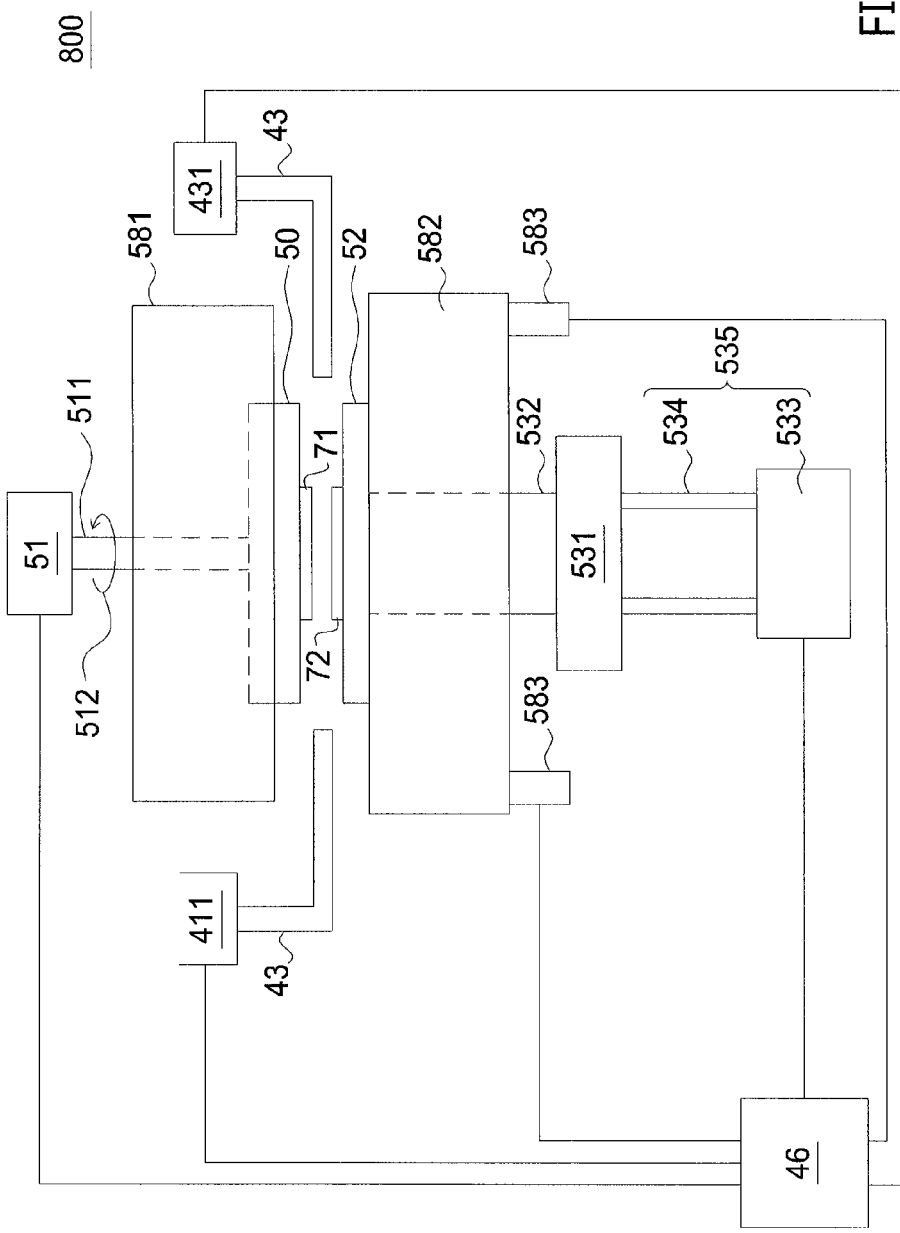
FIG. 8 shows an alignment bonding equipment for manufacturing an aligned-bonding light-emitting device in according with the eighth embodiment of the present application.

FIG. 8 shows an alignment bonding equipment 800 for manufacturing an aligned-bonding light-emitting device in accordance with the eighth embodiment of the present application. The alignment bonding equipment 800 comprises an upper carrier 50 for carrying a first wafer with a first alignment pattern, a lower carrier 52 under the upper carrier 50 for carrying a second wafer with a second alignment pattern, an angular alignment device 51 connecting with the upper carrier 50 via an angular alignment connector 511, a linear alignment device 531 connecting with the lower carrier 52 via an linear alignment connector 532, an up-down device 535 connecting to the linear alignment device 531, a first image deriving unit 41 connecting with a first movement device 411 for catching the images of the first alignment pattern and the second alignment pattern, a second image deriving unit 43 connecting with a second movement device 431 for catching the images of the first alignment pattern and the second alignment pattern, an upper chamber 581 enclosing the upper carrier 50, a lower chamber 582 enclosing the lower carrier 52, a chamber-lift device 583 connecting with the lower chamber 582 for raising or lowering the lower chamber 582, and a controller 46 electrically connecting with the angular alignment device 51, the linear alignment device 531, the up-down device 535, the first movement device 411, the second movement device 431 and the chamber-lift device 583.

The angular alignment device 51 is controlled by the controller 46 to rotate the upper carrier 50 via the angular alignment connector 511 for adjusting the angle 512 of the first wafer 71 relative to the second wafer 72. In one embodiment, the angular alignment device 51 can be a Direct Drive Motor. The linear alignment device 531 is controlled by the controller 46 for linearly moving the lower carrier 52 to adjust the horizontal position of the second wafer 72 relative to the first wafer 71. The up-down device 535 is controlled by the controller 46 for raising or lowering the linear alignment device 531, linear alignment connector 532, the lower carrier 52, and the second wafer 72, and for adjusting the bonding force between the first wafer 71 and the second wafer 72. The up-down device 535 comprises an up-down cylinder 533 and an up-down linking structure 534. The up-down cylinder 533 is controlled by the controller 46 to provide a certain power, and the up-down linking structure 534 can transfer the certain power to raise or lower the linear alignment device 531, linear alignment connector 532, the lower carrier 52, and the second wafer 72, or to adjust the bonding force between the first wafer 71 and the second wafer 72. In the embodiment, the bonding force between the first wafer 71 and the second wafer 72 is smaller than 1164 kgf/cm². The first movement device 411 and the second movement device 431 are controlled by controller 46 to move the first image deriving unit 41 and the second image deriving unit 43 respectively to the specific positions. The first image deriving unit 41 and the second image deriving unit 43 are operable for deriving the images of the first alignment pattern of the first wafer 71 and the second alignment pattern of the second wafer 72. The upper chamber 581 is fixed between the upper carrier 50 and the angular alignment device 51. The lower chamber 582, between the lower carrier 52 and the linear alignment device 531, connects with the chamber-lift device 583 controlled by the controller 46 to raise or lower the lower chamber 582. The lower chamber 582 can be raised by the chamber-lift device 583 to form a sealed chamber with the upper chamber 581. The first wafer 71 and the second wafer 72 are in the sealed chamber, and then the sealed chamber is vacuumed, wherein the air pressure of the sealed chamber is near 0 kgf/cm². In other words, the first wafer 71 and the second wafer 72 can be bonded in a vacuum environment.

Ninth Embodiment

FIG. 9 shows a method of manufacturing an aligned-bonding light-emitting device by use of the alignment bonding equipment 800 shown in FIG. 8. The first step 901 is disposing a first wafer 71 and a second wafer 72 on an upper carrier 50 and a lower carrier 52 respectively. In the second step 902, a first image deriving unit 41 and a second image deriving unit 43 are located in the original position. In the third step 903, the image deriving unit 41 and the second image deriving unit 43 are moved to catch the images of a first alignment pattern on the first wafer 71 and a second alignment pattern on the second wafer 72. Next, the fourth step 904 is that an angular alignment device 51 rotates the upper carrier 50, and a linear alignment device 531 linearly moves the lower carrier 52 to align the first alignment pattern and the second alignment pattern. Next, the fifth step 905 is moving the first image deriving unit 41 and the second image deriving unit 43 to the original position. Next, the sixth step 906 is raising the lower carrier 52 to make the first wafer 71 contacting the second wafer 72 and to provide a bonding force between the first wafer 71 and the second wafer 72. In the seventh step 907, the lower chamber 582 is raised to form a sealed chamber with the upper chamber 581. In the eighth step 908, the sealed chamber is vacuumed. In the ninth step 909, the bonding force between the first wafer 71 and the second wafer 72 is adjusted, for example, to be smaller than 1164 Kg/cm². Next, the tenth step 910 is heating the first wafer 71 and the second wafer 72 over 200° C. to form a bonded wafer. In the eleventh step 911, the first wafer 71 and the second wafer 72 are cooled down. Finally, the twelfth step 912 is lowering the lower carrier and the lower chamber for taking the bonded wafer out.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A method of manufacturing a light-emitting device, comprising the steps of:
   providing a semiconductor light-emitting stack having a first connecting surface and a first alignment pattern;
   providing a substrate having a second connecting surface and a second alignment pattern;
   providing an image deriving unit between the semiconductor light-emitting stack and the substrate capable of catching a first image of the first alignment pattern and a second image of the second alignment pattern; and
   moving the substrate and/or the semiconductor light-emitting stack to make the first alignment pattern be aligned with the second alignment pattern.

2. The method of manufacturing a light-emitting device according to claim 1, wherein the step of moving is to make the first alignment pattern be overlapped with the second alignment pattern.

3. The method of manufacturing a light-emitting device according to claim 1, further comprises a step of bonding the semiconductor light-emitting stack and the substrate together under a temperature over 200° C.

4. The method of manufacturing a light-emitting device according to claim 3, wherein a bonding force for bonding the semiconductor light-emitting stack and the substrate together is not over 1164 Kg/cm².

5. The method of manufacturing a light-emitting device according to claim 1, wherein the step of moving comprises moving linearly or rotating the substrate and the semiconductor light-emitting stack.

6. The method of manufacturing a light-emitting device according to claim 1, further comprising a step of catching a first image of the first alignment pattern and a second image of the second alignment pattern.

7. The method of manufacturing a light-emitting device according to claim 6, further comprising a step of comparing the first image and the second image.

8. The method of manufacturing a light-emitting device according to claim 1, wherein a first virtual vertical axis passing through the center of the first alignment pattern, a second virtual vertical axis passing through the center of the second alignment pattern, and an offset distance between the first virtual vertical axis and the second virtual vertical axis is smaller than 20 µm after the first alignment pattern being aligned with the second alignment pattern.

9. The method of manufacturing a light-emitting device according to claim 1, further comprising a step of providing a chamber, and the semiconductor light-emitting stack and the substrate are in the chamber.

10. The method of manufacturing a light-emitting device according to claim 9, further comprising providing an the image deriving unit in the chamber for catching a first image of the first alignment pattern and a second image of the second alignment pattern.

11. The method of manufacturing a light-emitting device according to claim 10, further comprising a step of moving the image deriving unit out of the chamber after the first alignment pattern being aligned with the second alignment pattern.

12. The method of manufacturing a light-emitting device according to claim 10, wherein the image deriving unit is in the chamber after the first alignment pattern being aligned with the second alignment pattern.

13. The method of manufacturing a light-emitting device according to claim 9, further comprising a step of heating chamber over 200° C. after the first alignment pattern being aligned with the second alignment pattern.

14. The method of manufacturing a light-emitting device according to claim 13, further comprising a step of bonding the semiconductor light-emitting stack and the substrate together by a bonding force not over 1164 Kg/cm$^2$.

\* \* \* \* \*